United States Patent [19]

Kakimoto et al.

[11] Patent Number: 4,655,850

[45] Date of Patent: Apr. 7, 1987

[54] METHOD OF FORMING MONOCRYSTALLINE THIN FILMS BY PARALLEL BEAM SCANNING OF BELT SHAPED REFRACTORY METAL FILM ON AMORPHOUS OR POLYCRYSTALLINE LAYER

[75] Inventors: Seizo Kakimoto, Tenri; Jun Kudo; Masayoshi Koba, both of Nara, all of Japan

[73] Assignee: Sharp Kabushiki Kaisha, Osaka, Japan

[21] Appl. No.: 750,263

[22] Filed: Jul. 1, 1985

[30] Foreign Application Priority Data

Jul. 2, 1984 [JP] Japan .................. 59-137583

[51] Int. Cl.⁴ ............... H01L 21/263; H01L 21/208; B05D 3/06
[52] U.S. Cl. .................. 148/1.5; 29/576 B; 29/576 T; 148/175; 148/187; 148/DIG. 93; 427/53.1
[58] Field of Search ............ 148/1.5, 187, 175; 29/576 B, 576 T; 427/43.1

[56] References Cited

U.S. PATENT DOCUMENTS

| | | | |
|---|---|---|---|
| 4,187,126 | 2/1980 | Radd et al. | 148/1.5 |
| 4,473,433 | 9/1984 | Bosch et al. | 427/53.1 |
| 4,487,635 | 12/1984 | Kugimiya et al. | 148/1.5 |
| 4,523,962 | 6/1985 | Nishimura | 148/1.5 |
| 4,543,133 | 9/1985 | Mukai | 148/1.5 |
| 4,545,823 | 10/1985 | Drowley | 148/1.5 |
| 4,561,906 | 12/1985 | Calder et al. | 148/1.5 |
| 4,564,403 | 1/1986 | Hayafuji et al. | 148/171 |

OTHER PUBLICATIONS

Fowler et al, IBM-TDB, 22, (1980), 5473.
Moore et al, Appl. Phys. Letts., 43, (Aug. 1983) 290.
Lasky, J. B., Jour. Appl. Phys., 53, (1982) 9038.
Egami et al, Appl. Phys. Letts., 43, (Dec. 1983) 1023.

*Primary Examiner*—Upendra Roy
*Attorney, Agent, or Firm*—Birch, Stewart, Kolasch & Birch

[57] ABSTRACT

A new method of manufacturing semiconductor devices, in which monocrystalline thin film is formed by melting and recrystallizing either amorphous or polycrystalline thin film via annealing by radiation of energy beams, wherein the manufacturing method comprises the formation of a belt-shaped high melting point metal film having a width narrower than the diameter of the radiated energy beams on either an amorphous or polycrystalline thin film and beam scanning in parallel with the belt, by means of radiating energy beams, onto the belt-shaped high melting point metal film, so as to generate a nucleus in a limited area beneath the belt-shaped thin film at the moment the film-covered amorphous or polycrystalline area dissolves recrystallizes so that the said recrystallized area eventually grows into a monocrystalline configuration.

6 Claims, 4 Drawing Figures

METHOD OF FORMING MONOCRYSTALLINE THIN FILMS BY PARALLEL BEAM SCANNING OF BELT SHAPED REFRACTORY METAL FILM ON AMORPHOUS OR POLYCRYSTALLINE LAYER

BACKGROUND OF THE INVENTION

The present invention relates to the method of manufacturing semiconductor devices, more particularly, to the method of manufacturing such semiconductor devices in which crystalization of either the amorphous or poly-crystalline thin film is promoted by melting and recrystalizing the thin film by radiating energy beams such as electron beams so that the recrystalized thin film can eventually grow into a monocrystalline configuration.

Recently, research has been intensively conducted for effectively applying monocrystalline thin films comprised of either amorphous or polycrystalline material to the substrate of semiconductors. However, none of the conventional methods can effectively provide enough of an area to allow the growth of monocrystals, and such a problem prevents manufacturers from adequately designing needed electronic circuits.

SUMMARY OF THE INVENTION

In light of the disadvantages that are still present in conventional techniques in conjunction with the manufacture of semiconductor devices as described above, the present invention aims at providing a useful method of manufcturing monocrystals that can reliably eliminate those disadvantages mentioned above, by monocrystalizing either amorphous or polycrystalline thin films, and significantly expands the monocrystalline field when compared to any of the conventional methods.

Other objects and further scope of applicability of the present invention will become apparent from the detailed description given hereinafter. It should be understood however, that the detailed description of and specific examples, while indicating preferred embodiments of the invention, are given by way of illustration only, since various changes and modifications within the spirit and scope of the invention will become apparent to those skilled in the art from this detailed description.

To achieve this, the present invention provides a unique method of manufacturing semiconductor devices in which a monocrystalline thin film is formed by melting and recrystalizing either amorphous or polycrystalline thin films via annealing means by radiation of energy beams wherein the manufacturing method comprises steps of forming a belt-shaped high-melting point metal film having a width narrower than the diameter of energy beams on either an amorphous or polycrystalline thin film, beam scanning in parallel with the belt by means of radiating energy beams onto the belt-shaped high-melting point metal thin film thereby generating a nucleus in a limited area beneath the belt-shaped thin film at the moment when the film-covered amorphous or polycrystalline area melts and recrystalizes so that the recrystalized area can eventually grow into a monocrystalline configuration.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Referring now to the accompanying drawings, one of the preferred embodiments of the present invention is described below. This embodiment comprises the following steps. First, the non-monocrystalizable thin film is covered with a relatively thin insulation film functioning as a protection film, followed by the production of a layered substrate configuration by laying up a piece of high-melting point metal thin film comprised of molybdenum (Mo) or tungsten (W) formed, for example, in a stripe-shape having a width narrower than the diameter of electron beams, in a position close to the area where the nucleus is to be generated when this metal film is developed into a monocrystalline state. Next, by radiating electron beams onto the prepared layered substrate, the portion of either the amorphous or polycrystalline thin film not covered by the high-melting point metal film is directly heated via the insulation film. Conversely, the high-melting point metal film covering either the amorphous or polycrystalline thin film absorbs energy from the incident electron beams, thus causing heat to be generated, which then heats the amorphous or polycrystalline film via the metal film. As a result, an ideal temperature distribution suited to the growth of a monocrystalline substance is realized where the center position of the melted substrate can always exhibit a temperature lower than the peripheral portions, in both cases, while the melting is underway by means of incident electron beams and where the melted substance is crystalized into monocrystals.

Figure 1:
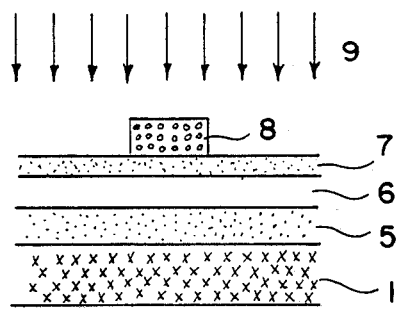
FIG. 1 is a sectional view of the substrate incorporating one of the preferred embodiments of the present invention.

FIG. 1 is a sectional view of the layered substrate reflecting one of the preferred embodiments of the present invention. Referring now to FIG. 1, an insulation film 5, composed of either $SiO_2$ or $Si_3N_4$, is formed on the surface of substrate 1 composed, for example, of silicon. Either an amorphous or polycrystalline silicon film 6, necessary for monocrystalization, is then formed on the surface of the insulation film 5, and, in addition, another insulation film 7, serving as a protection film, composed of either $SiO_2$ or $Si_3N_4$ is also formed on the surface of either the amorphous or polycrystalline silicon film 6. In addition, a piece of high-melting point metal film 8 comprised of molybdenum (Mo) or tungsten (W) featuring a significantly large electron-inhibitive function and high electron reflection rate is provided on the surface of the insulation film 7. Such a high-melting point thin film 8 is arranged in a belt-shaped pattern, while the width of this belt is regulated at approximately 10 to 20 micron meters, being narrower than the diameter of the incident electron beams.

Figure 2:
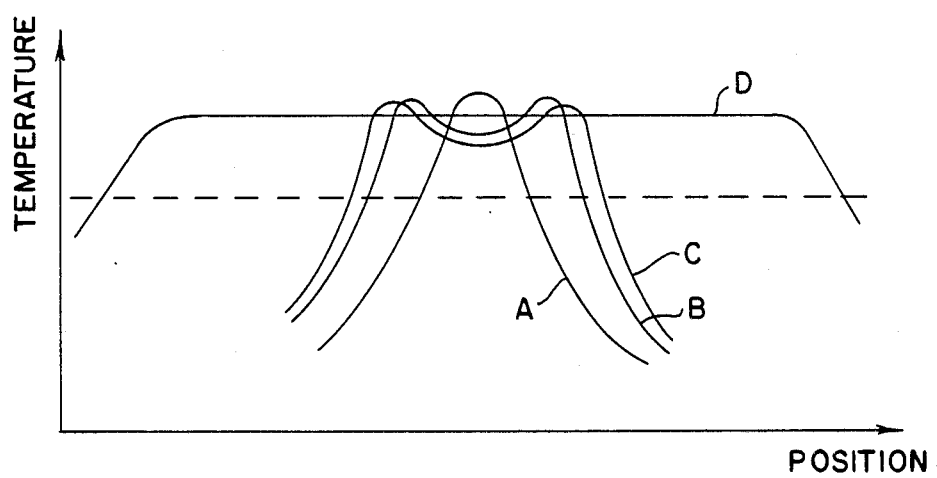
FIG. 2 is the temperature distribution while the annealing process is underway.

When annealing a layered substrate by radiating electron beams containing gaussion energy distribution characteristics, and the high-melting point thin film 8 is not formed, since the periphery of the melted portion absorbs an amount of energy less than the center position, as shown in the curve A of FIG. 2, the peripheral temperature remains lower than that at the center position. As a result, a nucleus is generated from polycrystalline silicon which is present in the peripheral portions during the recrystalization period, thus allowing polycrystals to grow. Therefore, in order to adequately promote the growth of monocrystals, it is necessary to realize an energy distribution such that the temperature in the center position can be lower than that of the peripheral portions when recrystalizing the melted substance. This causes the nucleus to be generated in the center of the dissolved area and allows monocrystals to grow without using polycrystalline silicon in the peripheral portions. Thus, in this preferred embodiment, a high-melting point thin film 8 is formed.

The incident electron beams directly heat the non-monocrystalizable silicon film 6 on both sides of the belt-shaped high-meltpoint metal film 8 when processing the substrate made in a configuration as described in FIG. 1. However, since the high-melting point metal film 8 effectively reflects and inhibits electrons, the energy of the incident electron beams on the layer portion beneath the film 8 decreases through the reflection effect, which is all absorbed by the film 8, thus causing this film 8 to raise its own temperature. The elevated temperature is then led to the amorphous or polycrystalline silicon film 6. This means that the high-melting point metal film 8 adequately inhibits the non-monocrystalizable silicon film 6 from raising its own temperature, thus creating such a temperature distribution in which the center position constantly bears a lower temperature than the periphery, as shown in curve B of FIG. 2. As a result, this sytem provides a nucleus generating position at the center position suited for the growth of monocrystals.

The high-melting point metal film 8 also prevents electron beams from reaching the portion that should be directly monocrystalized, thus effectively preventing the electron transmission path of the monocrystalline layer from damage. The thickness of the high-melting point metal film 8 featuring the electron inhibitive characteristics, i.e., electron absorbent characteristics, is provided so that it is greater than the flight range of electron beams and enough to absorb all the energy of electron beams into the film substance.

For example, when molybdenum (Mo) is used for making up the metal film 8 and then annealed by applying 10 KV of the acceleration voltage of electron beams, since each electron beam is assumed to have about 300 nanometers of flight range, this metal film 8 should be provided with a greater thickness. The thickness of the molybdenum film 8 is then determined within a range of approximately 1,000 through 1,500 nanometers in consideration of the effect of lowering temperature during the thermal conduction through the molybdenum film 8.

The insulation film 7 covering the silicon film 6 provides a variety of effects including the effect of delaying the thermal conduction from the high-melting point metal film 8 that absorbs electron beams, the effect of preventing the silicon film 6 from incurring damage caused by directly incident electron beams, and the effect of preventing possible stain otherwise caused by direct contact between the silicon film 6 and the electron absorbing high-melting point metal film 8. To quickly lower the metal-film-generated high temperature in the layer portion beneath the metal film 8 by means of thermal conduction through the silicon film 6, the insulation film 7 is provided with approximately 400 through 600 nanometers of the thickness.

Figure 3:
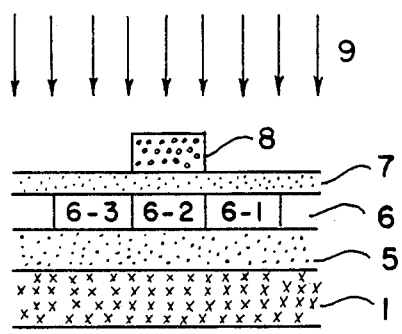
FIG. 3 is a sectional view of the substrate explaining the recrystalization process reflecting one of the preferred embodiments of the present invention.

FIG. 3 is a sectional view of the layered substrate showing the recrystalization process reflecting one of the preferred embodiments of the present invention. Referring now to FIG. 3, assume that electron beams 9 containing approximately 5 through 10 KV of acceleration voltage and the gaussion energy distribution denoted by approximately 100 through 200 micron meters of the beam diameter are radiated onto the prepared layer-substrate so that the center of the electron beams can correctly hit against the center position of the high-melting point metal film 8, then electron beams 9 penetrate into the non-crystalizable silicon film 6 through the insulation film 7, and as a result, temperature in the bare portions 6-1 and 6-3 of the silicon film 6, without coverage of the electron beam absorbing metal film 8, rises. Conversely, a part of the incident electron beams reflects against the portion 6-2 covered by the electron beam absorbing metal film 8, whereas the remaining electron beams are all absorbed by the metal film 8, thus causing the temperature of this film to rise. As a result, the generated heat is conducted to the non-crystalizable silicon film 6 through the insulation film 7. During this period, the temperature in the portion 6-2 just below the electron-beam absorbing metal film 8 becomes lower than the peripheral or bare portions 6-1 and 6-3 in the boundary area due to loss of energy caused by reflection of electron beams from the electron absorbing metal film 8 and the lowered temperature due to thermal transfer through the metal film 8 and the insulation film 7. As a result, as shown in curve C of FIG. 2, the temperature remains low in the center areas whereas it remains high in the peripheral areas. While such a temperature distribution is present, the nucleus is generated in the center area 6-2 when the melted solution coagulates itself. The nucleus then develops so that the monocrystalline thin film can be eventually formed. Thus, the above annealing process eventually generates monocrystals. After completing the annealing and subsequent process steps described, the high-melting point metal thin film 8 and the insulation film 7 are both removed by an etching process, and finally, the monocrystalline area is processed by photolithography so that the status suited for the manufacture of semiconductive elements can be generated.

Figure 4:
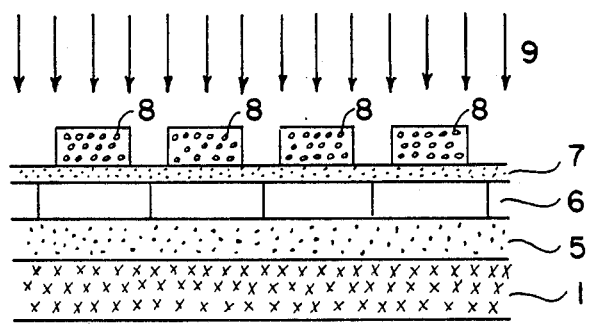
FIG. 4 is a sectional view of the substrate reflecting another preferred embodiment of the present invention.

FIG. 4 is a sectional view of the layer substrate representing another preferred embodiment of the present invention. This represents the configuration of the substrate available for generating a plurality of monocrystalline areas 6, connected to each other in a common thin film, by an annealing process that uses pseudo-linear electron beams. As was done in the foregoing preferred embodiment, this embodiment causes the stripe-shaped high-melting point metal film 8 to be formed in the line-and-space format by providing approximately 10 through 20 micron meters of the line width and approximately 5 micron meters of space, respectively. The pseudo-linear electron beams are formed by causing such spotty electron beams to deflect perpendicularly to the scanning direction in a width ranging from approximately 300 through a maximum of 600 micron meters by applying triangular waveform AC voltage (having approximately 100 through 300 kHz of the triangular waveform frequencies), where the spotty electron beams have the gaussion energy distribution denoted by approximately 100 through 200 micron meters of the beam diameter using approximately 1.8 through 2.0 mA of the beam current and approximately 5 through 10 KV of the acceleration voltage, respectively. Formation of the deflected pseudo-linear electron beams realizes an ideally uniform temperature distribution featuring the broad width shown by the solid line D of FIG. 2. A plurality of monocrystalline areas is formed by simultaneously annealing the area containing the plurality of stripes of the metal film 8 by applying the pseudo-linear electron beams. Since the width of the monocrystalline areas are connected to each other by setting the width of the line and space configuration at those values described earlier, monocrystalline areas are not always formed in the direction identical to each other. Thus, boundary layers are formed at the border of the monocrystalline areas. Applying this, the stripe-shaped monocrystalline areas closely connected to each other can be formed to several hundred microns of the width. In addition, it is also possible to form belt-like monocrystals covering the whole of the needed area by radiating partially overlapped pseudo-linear electron beams.

Also, by applying the layer pattern shown in FIG. 4, stripe-shaped monocrystalline areas connected to each other can be generated by radiating partially overlapped spotty electron beams. However, the crystalization effect may not be properly provided due to the disturbed temperature distribution when the spotty electron beams incorrectly pass through the center of the stripe of the metal film 8, or due to recurrence of the melting of the monocrystalized areas being adversely affected by radiation of the overlapped spotty electron beams.

To prevent this, it is suggested that application of the psuedo-linear electron beams could provide better stability and greater dimensions of the monocrystalline area than those offered by the spotty electron beams. In addition, it is possible to provide a greater throughput due to the greater range of annealing operation available. If any damage that may incur to the high-melting point metal film 8 due to radiation of electron beams is a critical problem, an insulation film composed of $SiO_2$ or $Si_3N_4$ may also be laid down on the surface of the metal film 8 for protection.

In the preferred embodiments of the present invention described above, high-melting point metals such as molybdenum (Mo) or tungsten (W) are described. However, the present invention is not restricted to the use of these elements, the only requirement necessary being that the high-melting point element must be capable of effectively absorbing and inhibiting the attack of electron beams without allowing their permeance. For example, a relatively thick polysilicon film may also be made available.

As is clear from the foregoing description, when recrystalizing the melted amorphous or polycrystalline thin film into monocrystals after completing annealing using electron beams, compared to any of the conventional methods, the preferred embodiments of the present invention can reliably realize monocrystalization of a semiconductive substrate by sharply minimizing the possibility of damage to the under-layer elements by the presence of the electron transmission line while installing monocrystalline layers and/or circuit elements using a layer structure. In addition, the preferred embodiments can better expand the monocrystalline area than any of the conventional methods.

The melting points of Tungsten (W), Molybdenum (Mo) are about 3387 degrees C. and about 2610 degrees C., respectively. In place of Tungsten and Molybdenum, Tantalum (Ta) or Zirconium (Zr) may be used in the present invention. The melting points of Tantalum and Zirconium are about 2996 degrees C. and about 1852 degrees C., respectively.

Also, the electron reflection ratios of Tungsten, Molybdenum, Tantalum and Zirconium are about 0.458, 0.421, 0.511, and 0.417, respectively.

The invention being thus described, it will be obvious that the same may be provided in many ways. Such variations are not to be regarded as a departure from the spirit and scope of the invention, and all such modifications are intended to be included within the scope of the following claims.

What is claimed is:

1. A method of manufacturing semiconductor devices, in which a monocrystalline thin film is formed by melting and recrystallizing either amorphous or polycrystalline thin film via annealing by radiation of energy beams of a specific diameter wherein the manufacturing method comprises the steps of:

forming a belt-shaped high melting point metal film featuring a large electron-absorbent function having a width narrower than the diameter of said radiated energy beams on either an amorphous or polycrystalline thin film having an insulator coating made of either $SiO_2$ or $Si_3N_4$ interpositioned between said thin film and said metal film; and beam scanning in parallel with said belt, by means of radiating energy beams, onto the said belt-shaped high-melting point metal film, thereby generating a nucleus in a limited area beneath said belt-shaped thin film at the moment said film-covered amorphous or polycrystalline area melts and recrystallizes so that said recrystallized area grows into a monocrystalline configuration.

2. A method of manufacturing the semiconductor devices of claim 1 further including the steps of:

applying a triangular-waveform AC voltage perpendicular to the scanning direction of said radiating energy beams having gaussion energy distribution, thus allowing the AC voltage to perform deflective scanning of said energy beams at extremely high speed so that pseudo-linear electron beams can be made available.

3. A method of manufacturing semiconductor devices as defined in claim 1, wherein the condition of said belt-shaped high-melting point metal film comprises approximately 10 to 20 micron meters of width when said metal film is annealed by means of electron beams; and said metal film is patterned into a line-and-space format when being annealed by means of pseudo-linear electron beams, while the line-and-space pattern comprises about 10 to 20 micron meters of lines and about 5 micron meters of space, respectively.

4. A method of manufacturing the semiconductor devices of claim 2, wherein:

either of said electron beams or said pseudo-linear electron beams comprise approximately 5 to 10 KV of acceleration voltage;

said electron beams each have approximately 100 to 200 micron meters of diameter; and deflection of said electron beams respectively range from approximately 300 to a maximum of approximately 600 micron meters of width when making up the pseudo-linear electron beams.

5. A method of manufacturing semiconductor devices as in claim 2, wherein the condition of the belt-shaped high-melting point metal film comprises approximately 10 to 20 micron meters of width when said metal film is annealed by means of electron beams and said metal film is patterned into a line-and-space format when being annealed by means of psuedo-linear electron beams, while the line-and-space pattern comprises about 10 to 20 micron meters of lines and about 5 micron meters of space, respectively.

6. A method of manufacturing semiconductor devices as defined in claim 4, wherein the condition of said belt-shaped high-melting point metal film comprises approximately 10 to 20 micron meters of width when said metal film is annealed by means of electron beams and said metal film is patterned into a line-and-space format when being annealed by means of psuedo-linear electron beams while the line-and-space pattern comprises about 10 to 20 micron meters of lines and about 5 micron meters of space, respectively.

* * * * *